(12) United States Patent
Fujiwara

(10) Patent No.: US 7,403,444 B2
(45) Date of Patent: Jul. 22, 2008

(54) SELECTABLE MEMORY WORD LINE DEACTIVATION

(75) Inventor: Yoshinori Fujiwara, Takezono (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/705,974

(22) Filed: Feb. 13, 2007

(65) Prior Publication Data

US 2007/0140038 A1    Jun. 21, 2007

Related U.S. Application Data

(63) Continuation of application No. 10/759,388, filed on Jan. 15, 2004, now Pat. No. 7,196,964.

(30) Foreign Application Priority Data

Dec. 9, 2003    (JP) .............................. 2003-411053

(51) Int. Cl.
*G11C 7/00* (2006.01)
(52) U.S. Cl. .............................. 365/230.06; 365/230.03
(58) Field of Classification Search ............ 365/230.06, 365/230.03
See application file for complete search history.

(56) References Cited

U.S. PATENT DOCUMENTS

| | | | |
|---|---|---|---|
| 5,113,374 A | 5/1992 | Matsui | |
| 5,202,855 A * | 4/1993 | Morton | ........................ 365/226 |
| 5,293,342 A | 3/1994 | Casper et al. | |
| 5,355,346 A | 10/1994 | Shin et al. | |
| 5,436,868 A | 7/1995 | Shin et al. | |
| 5,495,448 A | 2/1996 | Sachdev | |
| 5,596,521 A | 1/1997 | Tanaka et al. | |
| 5,737,275 A | 4/1998 | Matthews et al. | |
| 5,909,407 A | 6/1999 | Yamamoto et al. | |
| 6,034,904 A | 3/2000 | Kuromiya et al. | |
| 6,046,956 A | 4/2000 | Yabe | |
| 6,215,712 B1 | 4/2001 | Yanagisawa | |
| 6,262,929 B1 | 7/2001 | Miyatake et al. | |
| 6,262,934 B1 | 7/2001 | Uehara | |
| 6,507,533 B2 | 1/2003 | Sato | |
| 6,621,735 B2 | 9/2003 | Nakamura et al. | |
| 6,781,889 B2 | 8/2004 | Kliewer et al. | |
| 2002/0085408 A1* | 7/2002 | Ricodeau | .................... 365/149 |
| 2006/0044923 A1* | 3/2006 | Hahn et al. | ............ 365/230.06 |
| 2006/0171241 A1* | 8/2006 | Nam | .................... 365/230.06 |

* cited by examiner

*Primary Examiner*—Michael T Tran
(74) *Attorney, Agent, or Firm*—Ropes & Gray LLP; Jeffrey H. Ingerman; Chia-Hao La

(57) ABSTRACT

Circuitry and methods allow selected memory word lines (WLs) to be deactivated without using a global deactivate signal. All active WLs do not therefore have to be deactivated simultaneously, which can cause voltage at a common deactivate node to rise undesirably. This undesirable voltage rise can adversely affect a system by, for example, inadvertently activating an inactive WL. The invention advantageously limits the voltage fluctuation at the common deactivate node.

15 Claims, 7 Drawing Sheets

US 7,403,444 B2

SELECTABLE MEMORY WORD LINE DEACTIVATION

CROSS REFERENCE TO RELATED APPLICATION

This application is a continuation of U.S. patent application Ser. No. 10/759,388, filed Jan. 15, 2004, now U.S. Pat. No. 7,196,964, which claims priority to Japanese patent application No. JP2003-411053, filed Dec. 9, 2003, which are hereby incorporated by reference herein in their entireties.

BACKGROUND OF THE INVENTION

This invention relates to integrated circuit memories. More particularly, this invention relates to the deactivation of selected word lines in dynamic random access memories (DRAMs).

A DRAM is a form of semiconductor random access memory (RAM) commonly used as main memory in computers and other electronic systems. DRAMs store information in integrated circuits called cells, which hold one bit of information each. Cells are typically grouped into one-dimensional arrays called words.

In certain DRAM architectures, selection of a word for reading or writing occurs as follows: the word to be activated is determined by decoding an address. The selected word line (WL) is then connected to a common node with a sufficiently positive voltage, typically referred to as the VCCP node. Similarly, deactivation involves connecting the WL to a common node with a negative or sufficiently low voltage. This node may be ground or a special purpose node referred to herein as VWLN. As transistor sizes continue to shrink and transistor leakage current becomes more of a problem, the VWLN node is preferred over ground.

More than one WL may be activated or deactivated simultaneously for testing or other purposes. A problem sometimes arises when deactivating multiple WLs. The positive electrical charge residing on a previously activated word line discharges into the VWLN node, pulling the node's voltage up. In some cases, VWLN node voltage may increase enough to inadvertently activate WLs intended to remain deactivated, thus adversely affecting data integrity throughout a system.

Many systems rely on a single pre-charge signal that is shared across all WLs for WL deactivation. This sharing forces all WLs to be deactivated simultaneously. As a result, it is often impractical to activate more than a few WLs at a time, because their simultaneous deactivation could cause a substantial change in VWLN node voltage.

In view of the foregoing, it would be desirable to provide circuitry and methods that reduce the voltage fluctuation at the VWLN node, thus allowing more WLs to be active at the same time.

SUMMARY OF THE INVENTION

It is an object of this invention to provide circuitry and methods that reduce the voltage fluctuation at the VWLN node, thus allowing more WLs to be active at the same time.

In accordance with this invention, circuitry and methods are provided that deactivate selected WLs individually or in small selectable numbers, substantially reducing voltage fluctuation at the VWLN node. All activated WLs can still be deactivated in a short period of time, but their cumulative effect on VWLN node voltage is reduced, because the deactivation of all WLs is no longer simultaneous. That is, the number of simultaneously deactivated WLs can be controlled.

In a preferred embodiment of the invention, each WL is activated and deactivated by the output of a respective row address latch circuit. The latch circuit's inputs include an ACTIVE signal shared by all WLs and an address bit specific to each WL. By pulsing the ACTIVE signal while the address bit is active, a specific WL's activation status (i.e., active or inactive) can be toggled. This allows selected WLs to be deactivated, advantageously avoiding the simultaneous deactivation of all active WLs.

The invention therefore advantageously reduces voltage fluctuation at the VWLN node when deactivating multiple WLs, thus permitting more WLs to be active concurrently. This is particularly useful in reducing test time.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

Figure 1:
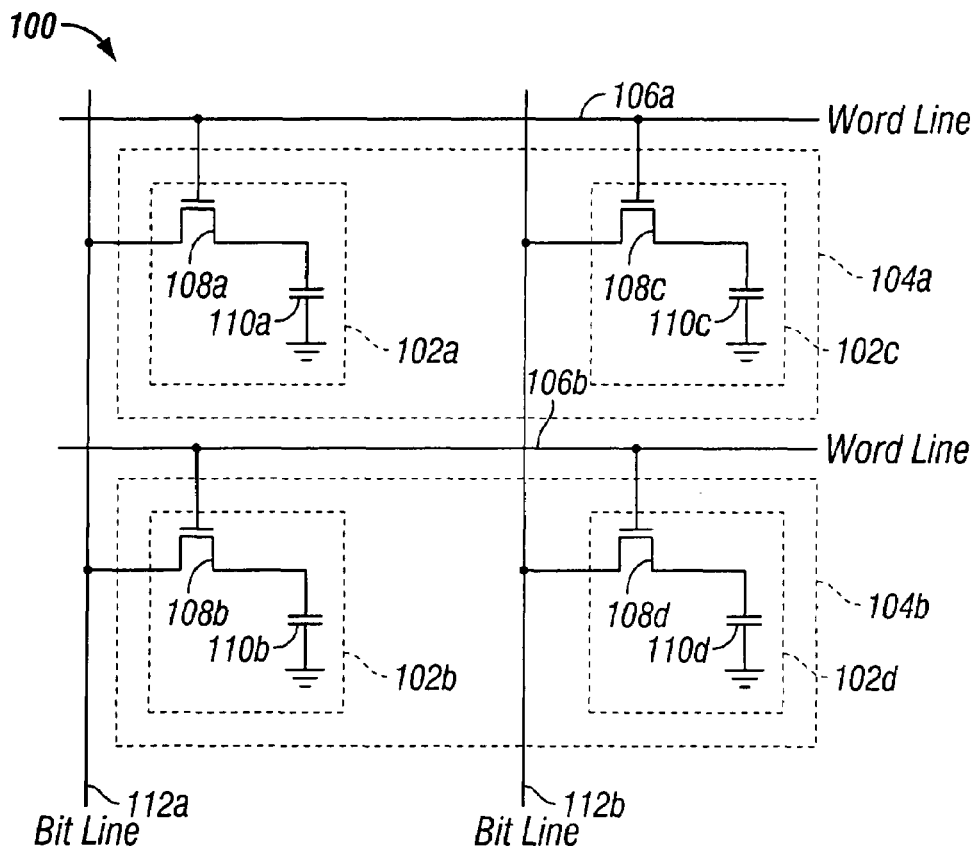
FIG. 1 is a circuit diagram of typical DRAM cells.

DRAMs are, in their simplest form, arrays of cells each including a capacitor for holding a charge and a transistor acting as a switch for accessing the charge held in the capacitor. DRAM arrays are typically arranged in columns and rows. FIG. 1 shows four DRAM cells 102a, b, c, d (four cells are shown merely for illustrative purposes). Each row of cells 104a and 104b is called a word. The transistor of each cell in a word is connected to a shared WL 106a or 106b. WLs 106a and 106b control the ON/OFF state of transistors 108a, b, c, d, which allow information to be read from or written to capacitors 110a, b, c, d. The information to be read or written is transferred via bit lines 112a, b. When a WL is activated, it drives the coupled transistors conductive (i.e., turns the transistors ON).

Figure 2:
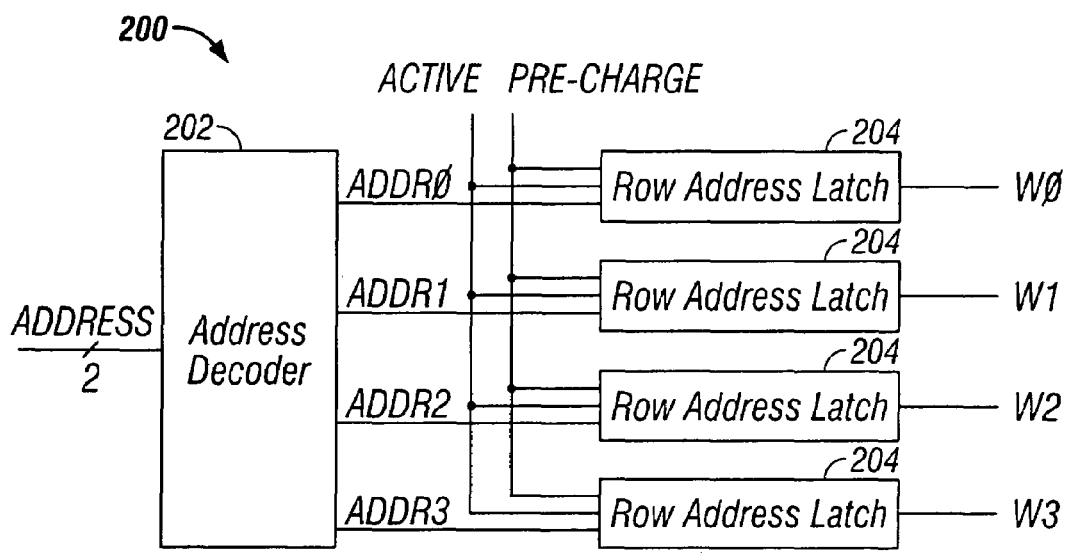
FIG. 2 is a block diagram of a representative WL activation/deactivation architecture.

FIG. 2 shows a representative activation/deactivation architecture for a DRAM with four WLs. The two-bit ADDRESS signal specifying which WL to activate is input into an address decoder 202. Decoder 202 has one output for each WL. It determines which WL is specified by the address and activates the corresponding output. The address decoder's outputs are then processed by row address latches 204. Each row address latch has three inputs, the ADDR signal from the decoder, a shared ACTIVE signal, and a shared PRE-CHARGE signal. Each row address latch has one output, which is connected to a specific WL. For example, the top row address latch has output signal W0, which is connected to WL0. The PRE-CHARGE signal deactivates all WLs in a section of a DRAM chip by connecting them to the VWLN node. The ACTIVE signal is pulsed after the address decoder's outputs have settled in order to activate only the target WL. During the pulse, each row address latch activates its output W and connects the WL to the VCCP node if its ADDR signal is active. After a WL has been activated, it can ordinarily only be deactivated by asserting the PRE-CHARGE signal.

Figure 3:
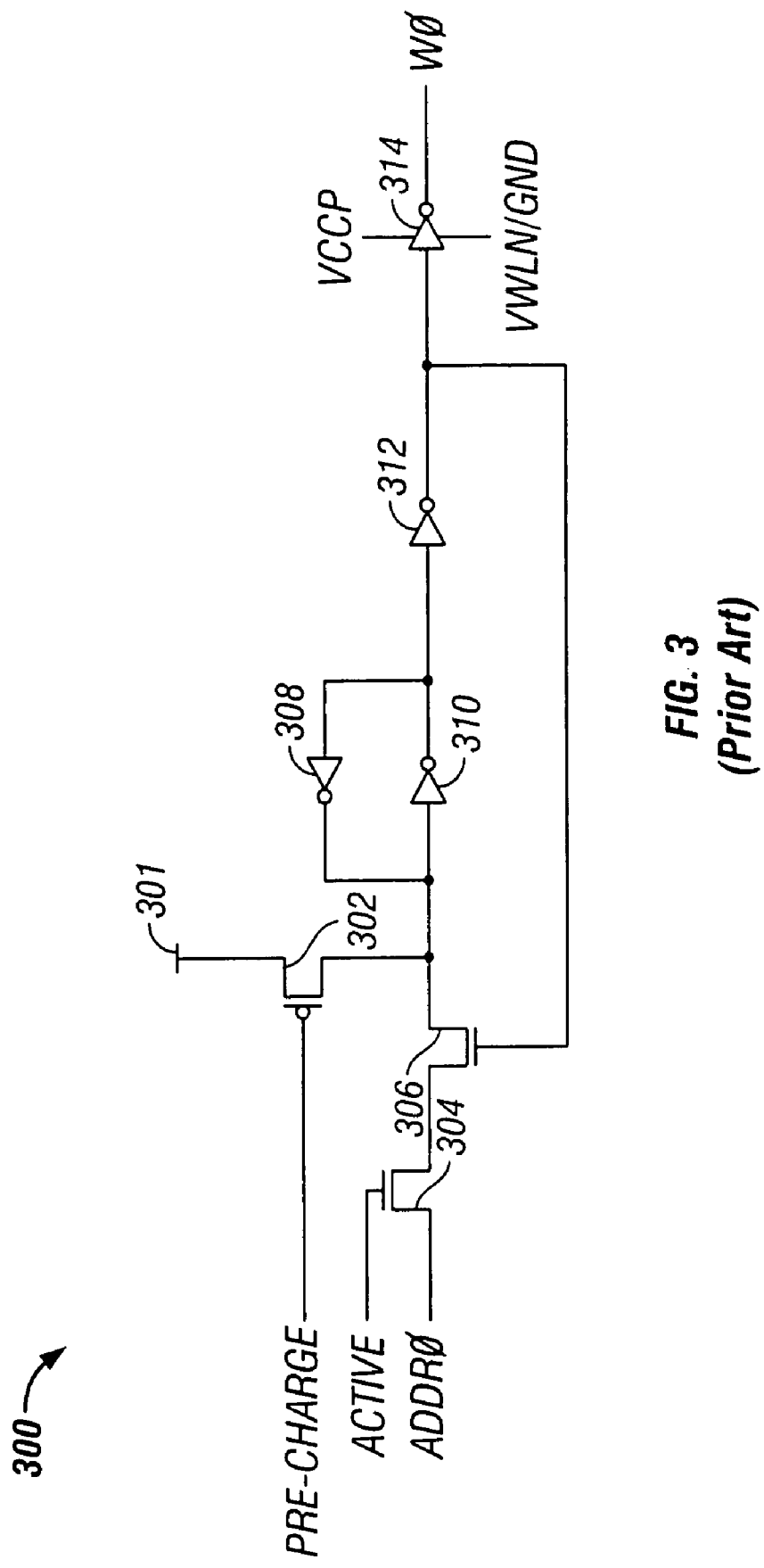
FIG. 3 is a circuit diagram of a typical row address latch.

FIG. 3 shows a typical row address latch 300. Latch 300 includes p-type transistor 302, n-type transistors 304 and 306, and inverters 308, 310, 312, and 314. Node 301 can be coupled to VCCP or another voltage level. Inputs PRE-CHARGE and ADDR0 are active low (i.e., activated by a logical 0 signal), while ACTIVE is active high (i.e., activated by a logical 1 signal). When PRE-CHARGE is driven to a logical 0, it activates transistor 302, which drives W0 low. Note that after PRE-CHARGE is asserted low, transistor 306 becomes conductive.

When the ACTIVE signal is a high pulse, it drives transistor 304 conductive. During the pulse, if ADDR0 is active (i.e., low), it drives output W0 high and activates the corresponding WL. When W0 is high, transistor 306 is non-conductive (its input from inverter 312 is low), and subsequent pulses on the ACTIVE input will have no effect on the W0 output. To deactivate this WL, the PRE-CHARGE signal is asserted low, which also simultaneously deactivates all other WLs in the same section of the DRAM chip. As described above, this can have an adverse effect on other WLs depending on the number of WLs being simultaneously deactivated.

Figure 4:
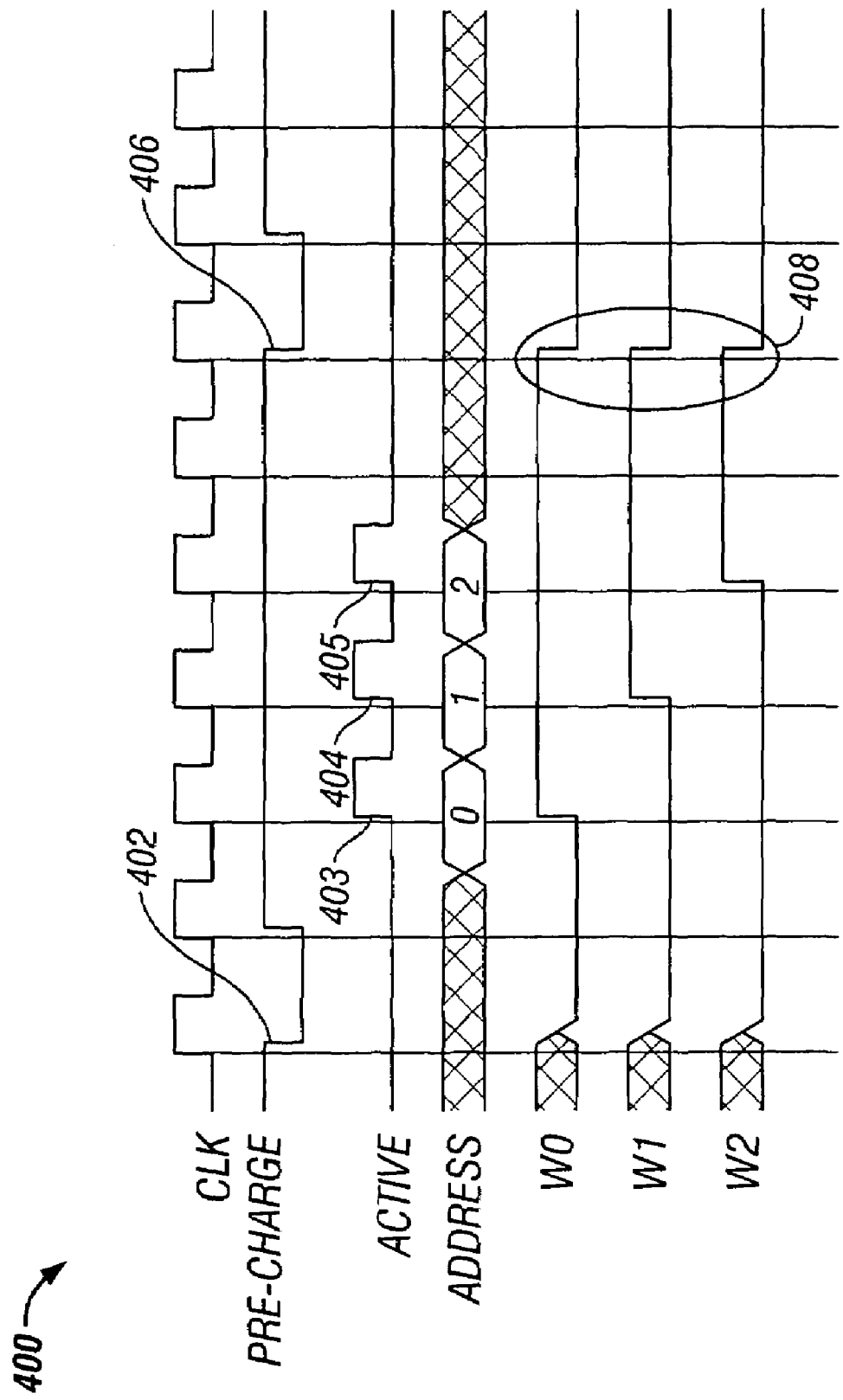
FIG. 4 is a timing diagram of input and output signals of the row address latch of FIG. 3.

FIG. 4 shows a timing diagram 400 in which three row address latches of FIG. 3 are used to respectively activate and deactivate three WLs. Signal CLK is a system clock signal. When PRE-CHARGE is pulsed low at signal transition 402, all three WLs are deactivated. Signal ACTIVE is then pulsed three times in conjunction with signal ADDRESS at signal transitions 403-405, activating W0, W1, and W2 in turn. Finally, when signal PRE-CHARGE is again pulsed low at signal transition 406, all three WLs are simultaneously deactivated in transition 408, causing the three associated WLs to be connected to the VWLN node. This simultaneous deactivation can result in a substantial amount of positive charge flowing into the VWLN node, causing the node's voltage to drift upwards undesirably.

Figure 5:
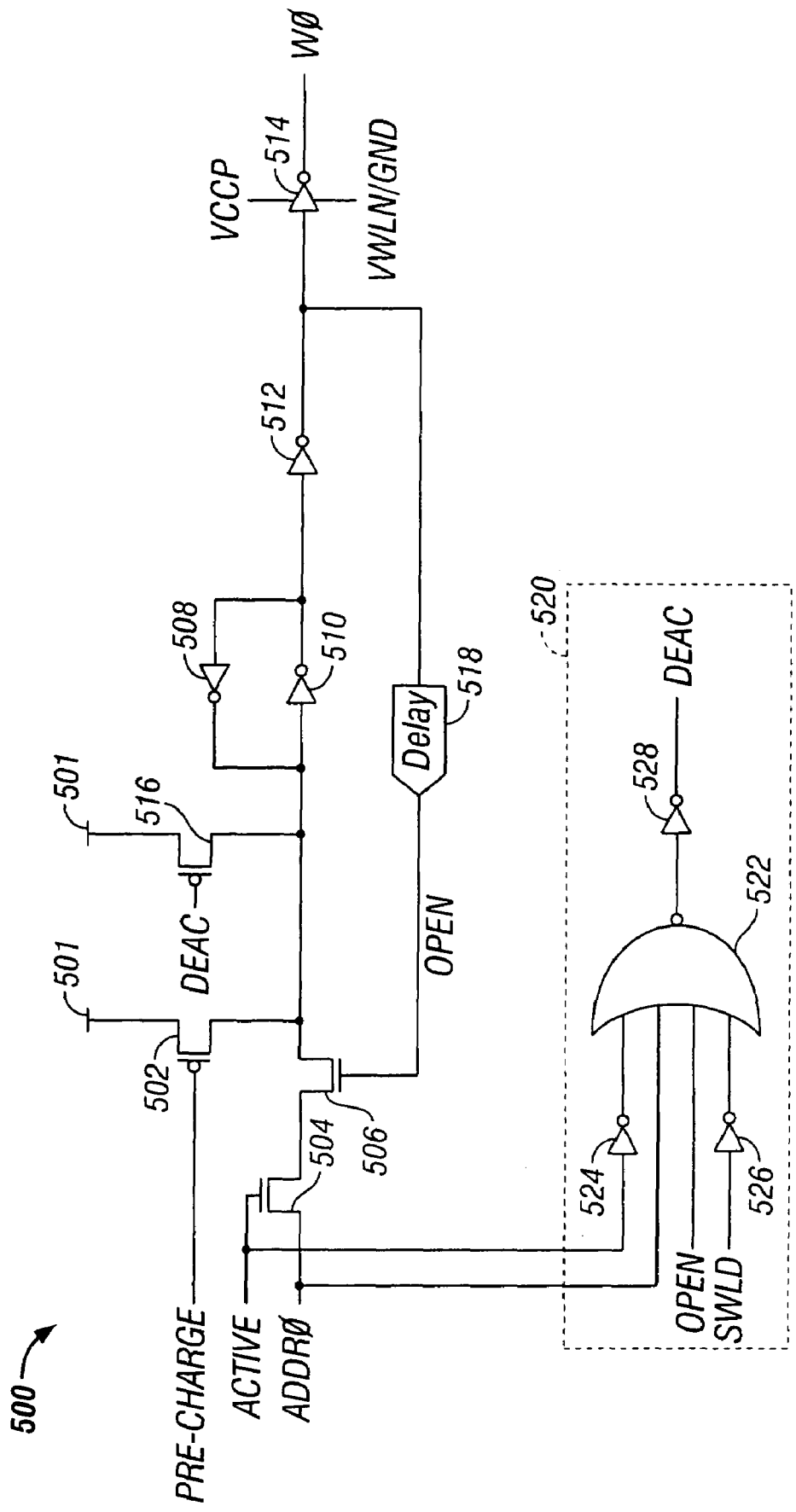
FIG. 5 is a circuit diagram of an exemplary embodiment of a row address latch according to the invention.

An exemplary embodiment of the invention is shown in FIG. 5. Row address latch circuit 500 includes p-type transistors 502 and 516, n-type transistors 504 and 506, inverters 508, 510, 512, and 514, delay element 518, and logic 520. Nodes 501 can be coupled to VCCP or another voltage level. Logic 520 controls transistor 516 via signal DEAC and preferably includes NOR gate 522 and inverters 524, 526, and 528. The SWLD input signal is active high and enables latch circuit 500 to selectively deactivate its WL.

Circuit 500 responds to a PRE-CHARGE pulse by deactivating its output W0 in the same fashion as latch circuit 300. When the ACTIVE signal is pulsed high while signal ADDR0 is low, output W0 will be asserted high. Note that during this assertion phase, transistor 516 is non-conductive, because the DEAC signal is a logical 1 when the ACTIVE pulse arrives. When ACTIVE is again pulsed high while SWLD is high and ADDR0 is low, logic 520 outputs the DEAC signal low, driving transistor 516 conductive and de-asserting W0. Thus, the row address latch according to the invention allows a specific WL to be deactivated, without using the PRE-CHARGE signal which is shared across all WLs. Delay element 508 assures that the ACTIVE pulse passes before output signal OPEN becomes high, driving transistor 506 conductive (signal OPEN is also fed to NOR gate 522). Note that until the next pulse of the PRE-CHARGE signal resets latch circuit 500, each time ACTIVE is pulsed high while SWLD is high and ADDR0 is low, the value of W0 will toggle (i.e., alternate between a logical 1 and a logical 0).

Figure 6:
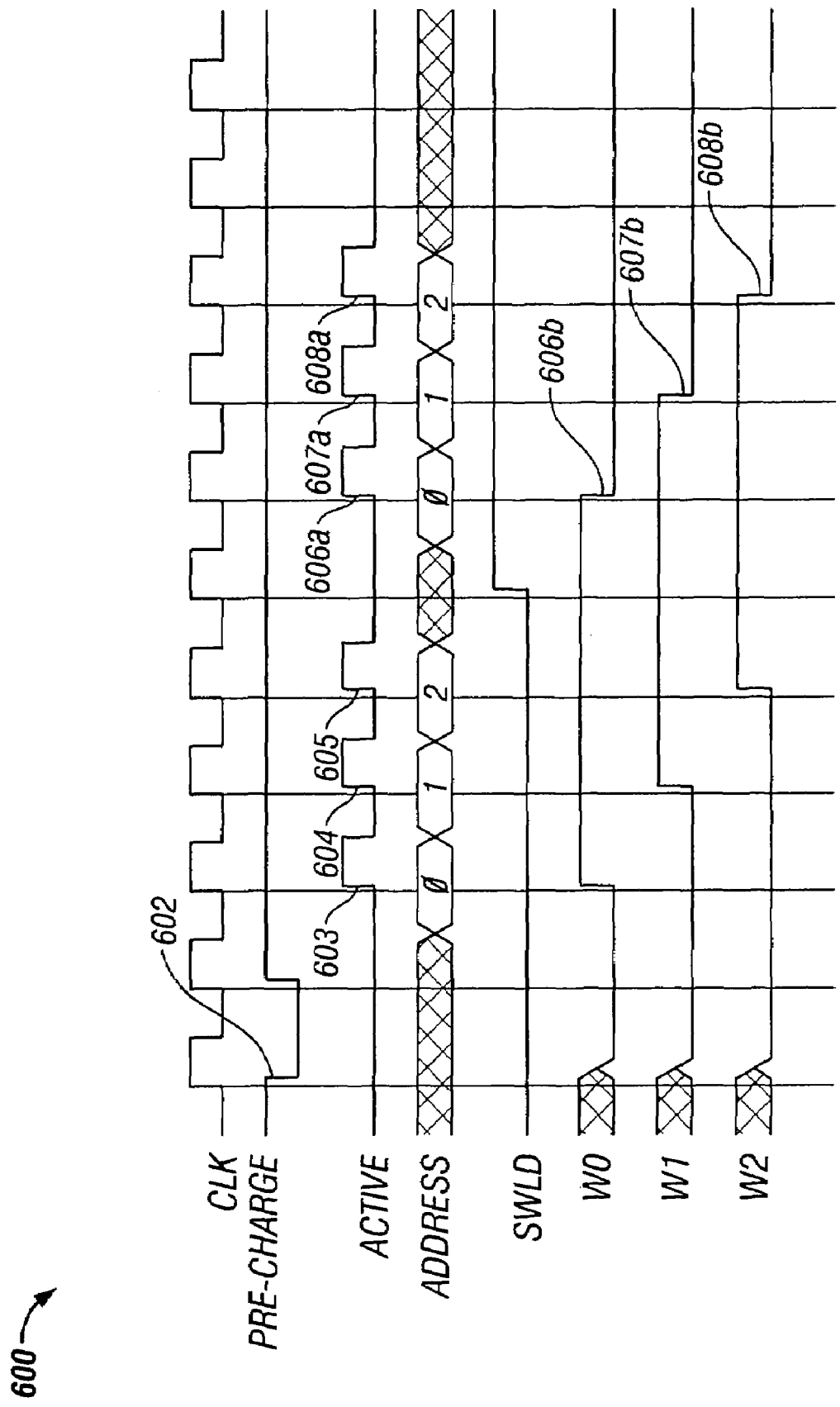
FIG. 6 is a timing diagram of input and output signals of the row address latch of FIG. 5 according to the invention.

FIG. 6 shows a timing diagram 600 of signals applied to latch circuit 500 according to the invention. Similar to latch circuit 300, transition 602 of signal PRE-CHARGE deactivates all WLs. Following this deactivation, the ACTIVE signal is pulsed three times in transitions 603-605 to activate all three WLs. Advantageously, however, the WLs can each be deactivated without asserting the PRE-CHARGE signal, and the deactivation of each WL need not be simultaneous with the deactivation of other WLs. Rather, the three successive pulses of the ACTIVE signal shown in transitions 606a, 607a, and 608a deactivate the three WLs in turn, illustrated in transitions 606b, 607b, and 608b. This non-simultaneous deactivation results in smaller transient spikes on the VWLN node than that caused by the simultaneous deactivation of all WLs at transition 408 of timing diagram 400.

Note that circuit 500 and timing diagram 600 are both merely illustrative. Other latch circuits that toggle the W0 output independently of the PRE-CHARGE signal can be used. For example, p-channel field effect transistor 516 could be replaced with an n-channel field effect transistor if inverter 528 were removed. Similarly, if the PRE-CHARGE signal were active high, transistor 502 could be replaced with an n-channel field effect transistor. Another possibility would be to force the output W0 to swing between ground and VCCP, rather than between VWLN and VCCP, by setting the voltage range of inverter 514 appropriately.

Figure 7:
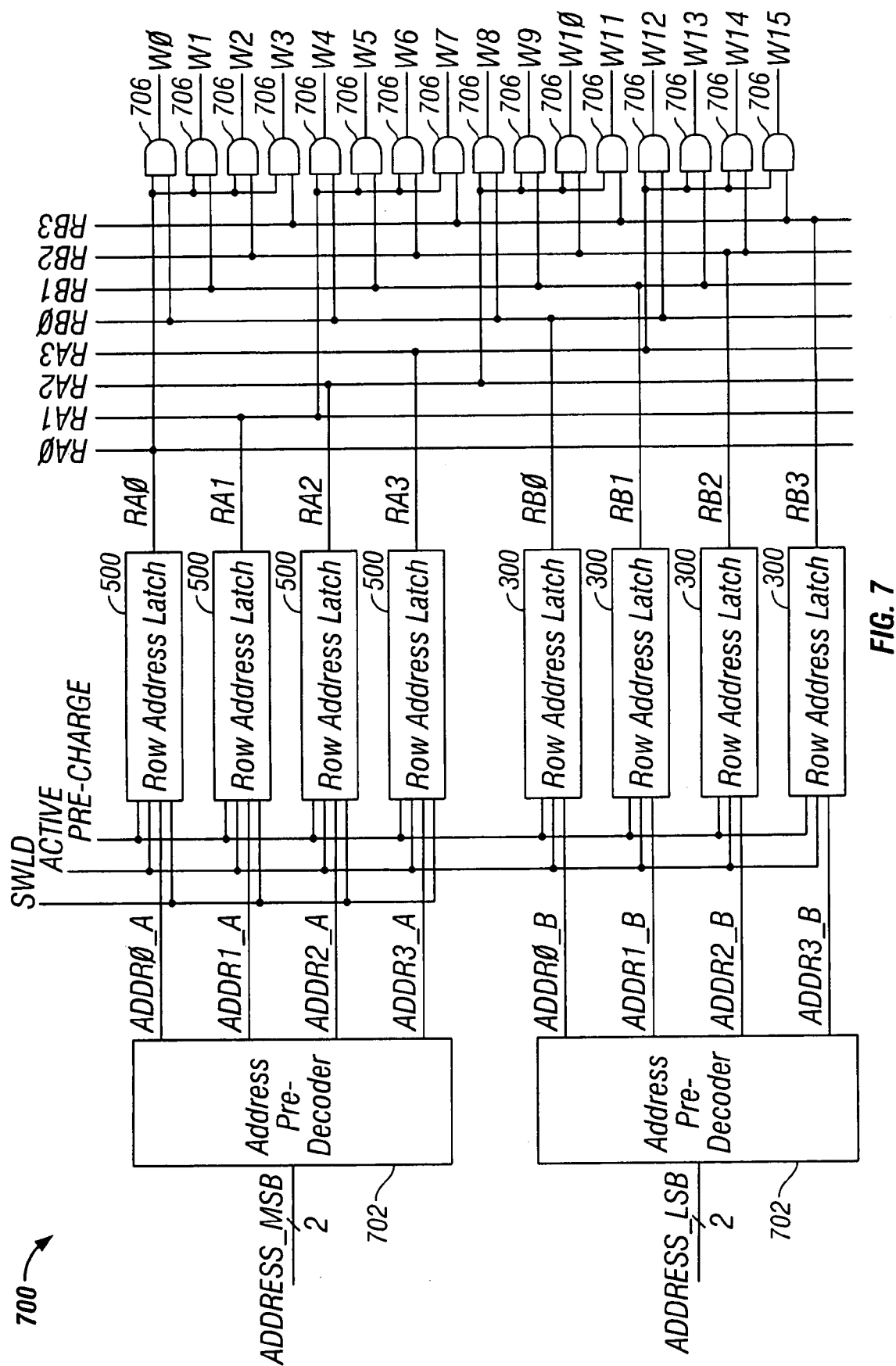
FIG. 7 is a block diagram of an alternative WL activation/deactivation architecture that incorporates the invention.

Also, the number of row address latches controlling each WL can vary from that shown. For example, FIG. 7 shows an activation/deactivation architecture where each WL is controlled by two row address latches. Architecture 700 includes address pre-decoders 702, row address latches 500, row address latches 300, and logical AND gates 706. In this example, decoding of a four-bit address occurs in two stages. In the first stage, the address' two most significant bits ADDRESS_MSB and its two least significant bits ADDRESS_LSB are separately decoded. Each address pre-decoder 702 outputs one ADDR signal low, and the others high. These outputs are then processed by row address latches 500 or 300 according to the invention. In the final stage of decoding, each WL is tied to the outputs of two row address latches by an AND gate 706, one latch output for each address pre-decoder 702. These two latch outputs represent the combination of ADDRESS_MSB and ADDRESS_LSB values that correspond to a particular WL's address. Thus, a given WL can only be activated if both its corresponding latch outputs are high. Note that, in FIG. 7, any given row address latch 500 is tied to more than one WL. Thus, in contrast with the architecture of FIG. 2, the architecture shown in FIG. 7 makes it possible to activate or deactivate multiple WLs with a single ACTIVE pulse. For instance, suppose the four WLs tied to signals W0-W3 were activated. If latch output RA0 were subsequently driven low, then those four WLs would all be simultaneously deactivated. The number of row address latches could alternatively depend on other considerations as well.

Timing diagram 600 could also vary, depending on the particular application required. For example, circuit 500 could be used to deactivate only WL0 and WL1, and the PRE-CHARGE signal could have been pulsed to deactivate WL2. Other operation sequences are possible, depending on, for example, the task to be performed and the limitations of the hardware.

Figure 8:
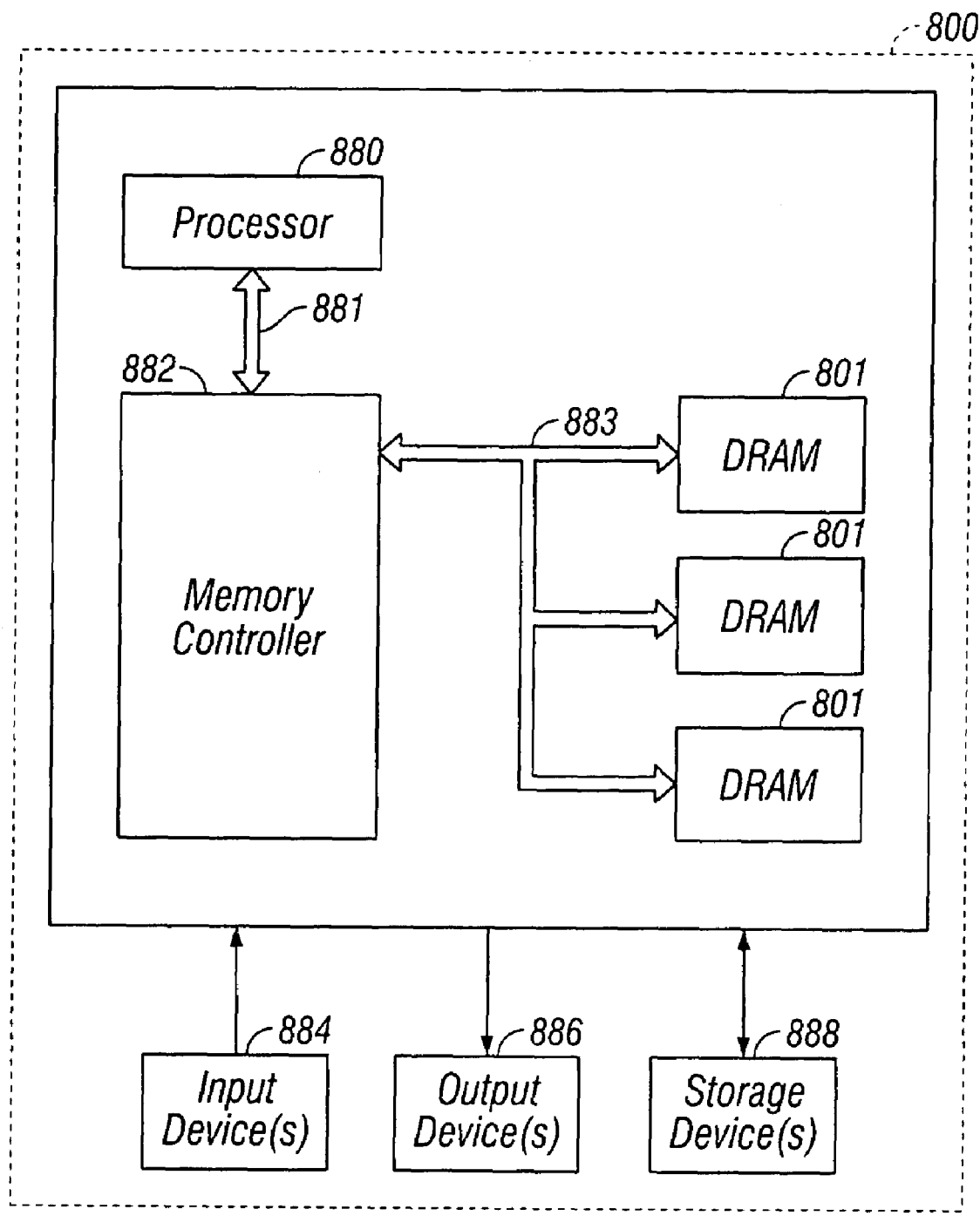
FIG. 8 is a block diagram of a system that incorporates the invention.

FIG. 8 shows a system that incorporates the invention. System 800 includes a plurality of DRAM chips 801, a processor 880, a memory controller 882, input devices 884, output devices 886, and optional storage devices 888. DRAM chips 801 each include one or more latch circuits 500. Data and control signals are transferred between processor 880 and memory controller 882 via bus 881. Similarly, data and control signals are transferred between memory controller 882 and DRAM chips 801 via bus 883. Input devices 884 can include, for example, a keyboard, a mouse, a touch-pad display screen, or any other appropriate device that allows a user to enter information into system 800. Output devices 886 can include, for example, a video display unit, a printer, or any other appropriate device capable of providing output data to a user. Note that input devices 884 and output devices 886 can alternatively be a single input/output device. Storage devices 888 can include, for example, one or more disk or tape drives.

Note that the invention is not limited to DRAM chips, but is applicable to other integrated circuit chips having a circuit or group of circuits where the simultaneous activation or deactivation of certain signal lines is undesirable.

Thus it is seen that circuits and methods are provided to deactivate multiple WLs individually or in small selectable numbers, thus reducing the total number of WLs deactivated simultaneously. One skilled in the art will appreciate that the invention can be practiced by other than the described embodiments, which are presented for purposes of illustration and not of limitation, and the present invention is limited only by the claims which follow.

I claim:

1. A memory circuit comprising:
   address decoder circuitry; and
   a plurality of row addresses latches coupled to receive respective address signals from the address decoder circuitry, wherein each row address latch is operable to:
   receive a deactivate-enable signal with a first logical value;
   receive a first pulse of an active signal;
   activate a word line of the memory circuit corresponding to the respective address signal in response to receiving the first pulse of the active signal when the deactivate-enable signal has the first logical value;
   receive the deactivate-enable signal with a second logical value;
   receive a second pulse of the active signal; and
   deactivate the word line of the memory circuit corresponding to the respective address signal in response to receiving the second pulse of the active signal when the deactivate-enable signal has the second logical value.

2. The memory circuit of claim 1 wherein each row address latch is further operable to:
   receive the respective address signal with a first logical value; and
   activate the word line of the memory circuit corresponding to the respective address signal only when the address signal has the first logical value.

3. The memory circuit of claim 2 wherein each row address latch is further operable to deactivate the word line of the memory circuit corresponding to the respective address signal only when the address signal has the first logical value.

4. The memory circuit of claim 1 wherein each row address latch is further operable to:
   receive a precharge signal with a first logical value; and
   deactivate the word line corresponding to the respective address signal in response to receiving the precharge signal with the first logical value.

5. The memory circuit of claim 1 wherein the address decoder circuitry comprises address pre-decoder circuitry.

6. The memory circuit of claim 1 wherein each row address decoder is operable to deactivate the word line of the memory circuit corresponding to the respective address signal in response to receiving the second pulse of the active signal only if a logical value of the second pulse is substantially equal to a logical value of the first pulse.

7. A system comprising:
   a processor;
   a memory controller coupled to the processor; and
   a memory chip coupled to the memory controller, wherein the memory chip comprises the memory circuit of claim 1.

8. A method comprising:
   receiving a first address signal with a first logical value;
   receiving a deactivate-enable signal with a first logical value;
   receiving a first pulse of an active signal;
   activating a word line of a memory circuit corresponding to the first address signal in response to receiving the first pulse of the active signal when the deactivate-enable signal has the first logical value and the first address signal has the first logical value;
   receiving the deactivate-enable signal with a second logical value;
   receiving a second pulse of the active signal; and
   deactivating the word line of the memory circuit corresponding to the first address signal in response to receiving the second pulse of the active signal when the deactivate-enable signal has the second logical value and the first address signal has the first logical value.

9. The method of claim 7 wherein the activating the word line of the memory circuit corresponding to the first address signal only occurs when the first address signal has the first logical value.

10. The method of claim 8 wherein the deactivating the word line of the memory circuit corresponding to the first address signal only occurs when the first address signal has the first logical value.

11. The method of claim 7 further comprising:
    receiving a precharge signal with a first logical value; and
    deactivating the word line corresponding to the first address signal in response to receiving the precharge signal with the first logical value.

12. The method of claim 7 further comprising decoding a multi-bit address signal to generate the first address signal.

13. The method of claim 12 wherein the decoding the multi-bit address signal comprises pre-decoding the multi-bit address signal.

14. The method of claim 7 wherein the deactivating the word line of the memory circuit corresponding to the first address signal in response to receiving the second pulse of the active signal only occurs when a logical value of the second pulse is substantially equal to a logical value of the first pulse.

15. A memory circuit comprising:
    means for receiving an address signal with a first logical value;
    means for receiving an enable signal with a first logical value;
    means for receiving a first pulse of an active signal;
    means for activating a word line of a memory circuit corresponding to the address signal in response to receiving the first pulse of the active signal when the deactivate-enable signal has the first logical value and the address signal has the first logical value;
    means for receiving the deactivate-enable signal with a second logical value;
    means for receiving a second pulse of the active signal; and
    means for deactivating the word line of the memory circuit corresponding to the address signal in response to receiving the second pulse of the active signal when the deactivate-enable signal has the second logical value and the address signal has the first logical value.

* * * * *